(12) United States Patent
Daikokuya (10) Patent No.: US 8,418,029 B2
(45) Date of Patent: Apr. 9, 2013

(54) STORAGE CONTROL DEVICE AND STORAGE CONTROL METHOD

(75) Inventor: Hidejirou Daikokuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 361 days.

(21) Appl. No.: 12/815,762

(22) Filed: Jun. 15, 2010

(65) Prior Publication Data

US 2010/0332947 A1    Dec. 30, 2010

(30) Foreign Application Priority Data

Jun. 29, 2009   (JP) .................................. 2009-153359

(51) Int. Cl.
*H03M 13/05*  (2006.01)
*G06F 11/00*  (2006.01)

(52) U.S. Cl.
USPC ........................................................ 714/763

(58) Field of Classification Search ................... 714/763
See application file for complete search history.

(56) References Cited

U.S. PATENT DOCUMENTS

| | | | |
|---|---|---|---|
| 6,216,247 B1 * | 4/2001 | Creta et al. ..................... | 714/763 |
| 6,256,762 B1 | 7/2001 | Beppu | |
| 6,397,365 B1 * | 5/2002 | Brewer et al. .................. | 714/766 |
| 7,617,437 B2 * | 11/2009 | Moyer .............................. | 714/763 |
| 7,650,557 B2 * | 1/2010 | Totolos, Jr. .................... | 714/763 |
| 7,774,683 B2 * | 8/2010 | Keays et al. ................... | 714/765 |
| 7,836,379 B1 * | 11/2010 | Ricci et al. ..................... | 714/770 |
| 8,145,985 B2 * | 3/2012 | Moyer .............................. | 714/799 |
| 8,151,173 B2 * | 4/2012 | Hirose et al. ................... | 714/785 |
| 8,214,720 B2 * | 7/2012 | Tanaka et al. .................. | 714/764 |
| 8,214,725 B2 * | 7/2012 | Sugahara ....................... | 714/785 |
| 8,219,882 B2 * | 7/2012 | Tamura et al. ................. | 714/763 |
| 8,225,172 B2 * | 7/2012 | Kasa ............................... | 714/758 |
| 8,230,157 B2 * | 7/2012 | Kim et al. ....................... | 711/103 |

FOREIGN PATENT DOCUMENTS

JP    10-207726 A    8/1998

* cited by examiner

*Primary Examiner* — James C Kerveros
(74) *Attorney, Agent, or Firm* — Fujitsu Patent Center (57) ABSTRACT

A storage control apparatus includes a storage unit having a plurality of blocks for storing data, each of the plurality of blocks being detected for data error by an error check code (ECC), a processor to execute a process to at least, modify an ECC stored in one of the storage unit, detect data-reading error in at least one block in the storage unit based on the modified ECC, and determine the number of detected blocks in the storage unit.

18 Claims, 11 Drawing Sheets

| BLOCK #0 | BLOCK #1 | BLOCK #2 | BLOCK #3 | ERROR DETECTION CODE |

| BLOCK #0 | BLOCK #1 | BLOCK #2 | BLOCK #3 | ERROR DETECTION CODE | BLOCK #4 | BLOCK #5 | BLOCK #6 | BLOCK #7 | ERROR DETECTION CODE |

| BLOCK #0 | BLOCK #1 | BLOCK #2 | BLOCK #3 | BLOCK #4 | BLOCK #5 | BLOCK #6 | BLOCK #7 | ERROR DETECTION CODE |

STORAGE CONTROL DEVICE AND STORAGE CONTROL METHOD

CROSS-REFERENCE TO RELATED APPLICATION

This application is based upon and claims the benefit of priority of the prior Japanese patent application no. 2009-153359, filed on Jun. 29, 2009 the entire contents of which are incorporated herein by reference.

FIELD

The embodiment discussed herein is related to a storage control device and method including a storage device.

BACKGROUND

In recent years, the capacity of storage devices increases rapidly, and hence the loss suffered when a storage fails becomes larger and larger. Thus, one technique conventionally used to prevent such a data loss and increase processing performance is through the use of RAID (Redundant Array of Inexpensive Disks). Also, in recent years, the capacity increase and the price reduction of semiconductor storage devices progress rapidly to allow their use in RAID devices, which typically used hard disks (HDDs; Hard Disk Drives) in the past. As such a semiconductor disk device, there is an SSD (Solid State Device). The SSD is a storage device which uses a flash memory and has features such as high-speed, low power consumption, small size/light weight, and impact resistant.

In general, when writing data to a semiconductor disk device, an error correction code (ECC) is added to the data. When reading the data, error detection processing and correction processing using the ECC are performed. As a data range in which the ECC is calculated, a value unique to each model of the semiconductor disk device products is set. For example, appropriate ranges are set, such as, a range is set for every one block which is a management unit of the data area in an SSD, or a range is set for every two or every four blocks by dividing continuous blocks into small groups of blocks. There is a semiconductor disk device in which a unit amount of data transferred from a buffer memory is further divided into a plurality of banks and an ECC is set for each bank. Japanese Laid-open Patent Publication No. 10-207726 may relate the above art. Hereinafter, the type of the product is referred to as "model". For example, the model may be identified by a model name or a model number set on the product.

When a medium error is detected by an error detection code such as the ECC, in a RAID device, a storage control device restores data in a storage in which the error is detected by using data of another storage having a redundant configuration.

A problem with conventional storage devices such as those described above is that a recovery range needs to be set in advance in corresponding storage control devices.

In data restoration processing (hereinafter referred to as "recovery processing") in a RAID device, the processing is performed on the recovery area, which is an entire area covered by an error detection code and including the data area in which the medium error occurs. For example, when the error detection code is generated for every two blocks, the recovery range is two blocks which is covered by the error detection code and includes the area in which the medium error occurs. Also, the recovery processing for two blocks is required. Therefore, the recovery range needs to be registered in advance in the storage control device which controls the recovery processing.

In particular, in a semiconductor disk device, a recovery range unique to each model is set, and it is difficult to change the recovery range after the recovery range is set. Therefore, when a semiconductor disk device is included in a RAID configuration, an operation is required in which the specification of the model of the semiconductor disk device is studied and the recovery range unique to the model is registered in advance. Furthermore, when a new model is added or a model is replaced, it is necessary to change registration information related to the recovery ranges. However, the operation to change the recovery ranges every time a model is changed or a model is added is very troublesome. In addition, since the operation is a manual operation, a registration error and a registration failure may occur. In such a case, there is a risk that a malfunction of the storage device occurs. It is not limited to semiconductor disk devices, and the same problem may occur when a unique error code is added to data stored in a storage.

SUMMARY

According to an aspect of the invention, a storage control apparatus includes a storage unit having a plurality of blocks for storing data, each of the plurality of blocks being detected for data error by an error check code (ECC), a processor to execute a process to at least, modify an ECC stored in one of the storage unit, detect data-reading error in at least one block in the storage unit based on the modified ECC, and determine the number of detected blocks in the storage unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENT

Hereinafter, preferred embodiment will be described in detail with reference to drawings.

Figure 1:
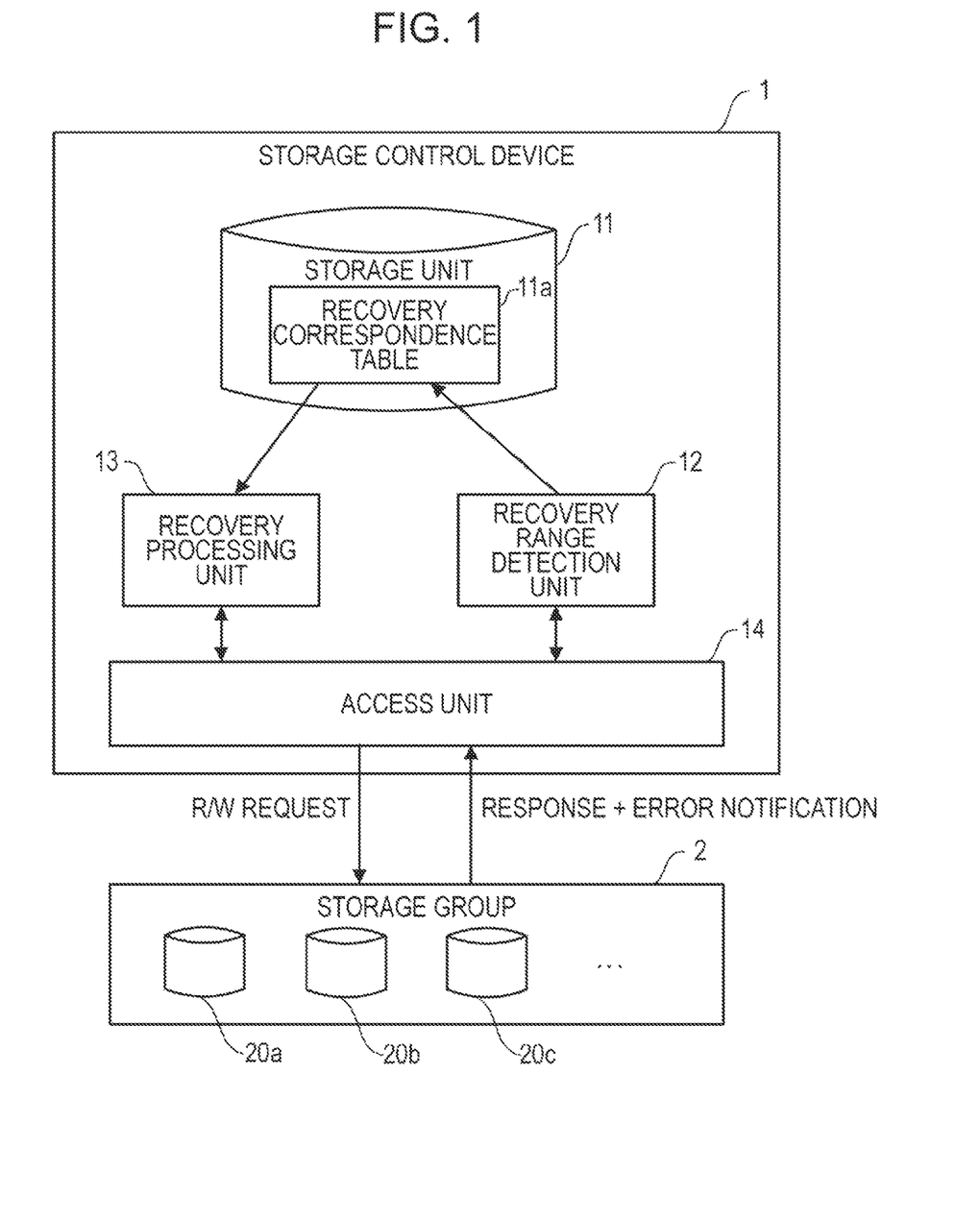
FIG. 1 is a diagram illustrating a configuration example of a storage device according to a first embodiment.

FIG. 1 is a diagram illustrating a configuration example of a storage device according to a first embodiment.

The storage device includes a storage control device 1 and a storage group 2 including a plurality of storages 20a, 20b, and 20c.

The storage group 2 includes storages 20a, 20b, and 20c which provide redundancy, and when a data abnormality is detected in a data area in one of the storages, data in the area having data abnormality may be restored by using redundant data in another storage. A physical storage area in each of the storages 20a, 20b, and 20c (redundant storage group) is divided into predetermined block units and managed. When writing data into its the physical storage area, each of the storages 20a, 20b, and 20c generates an error detection code for one block or for every predetermined number of continuous blocks, and store the error detection code in the physical storage area along with the data. The number of blocks for which one error detection code is generated is determined for each storage in advance. In most cases, the range of the number of blocks is unique for each storage product type, in other words, for each model. A range where the error detection code is generated is a recovery range on which recovery processing is performed. As an error detection code, ECC or the like is used.

The storage control device 1 includes a storage unit 11, a recovery range detection unit 12, a recovery processing unit 13, and an access unit 14, and performs data restoration processing when a medium error occurs in the storages 20a, 20b, or 20c belonging to the storage group 2, or the like.

A recovery correspondence table 11a generated by the recovery range detection unit 12 is stored in the storage unit 11. Sizes of recovery ranges, in which the recovery processing are to be performed as a whole in the storages 20a, 20b, and 20c respectively, are associated with the storages 20a, 20b, and 20c and registered in the recovery correspondence table 11a. In most cases, the recovery range is set as a value unique to each storage model in advance. Therefore, in the recovery correspondence table 11a, the sizes of the recovery ranges may be associated with the storage models and registered. When using the recovery correspondence table 11a in which the sizes of the recovery ranges are associated with the storage models, the model of the target storage is determined, and the recovery correspondence table 11a is searched on the basis of the determined storage model.

The recovery range detection unit 12 detects the recovery range for each model of the storages 20a, 20b, and 20c belonging to the storage group 2, and registers the recovery ranges in the recovery correspondence table 11a. Generally, the recovery range is unique to each storage model, so that the recovery range may be detected only once for each storage model. To detect the recovery range, first, the error detection code stored in the physical storage area in the target storage is broken, and a media error is deliberately generated. When the storages 20a, 20b, or 20c receives a data read request, the medium error occurs if the error detection code generated from the read data does not match the error detection code stored in the physical storage area. If the error detection code is broken, the medium error occurs when data is read from an area in the recovery range corresponding to the broken error detection code. Therefore, data is sequentially read from the target storage, and an error occurrence area where the medium error occurs is detected. Then, the recovery range is determined on the basis of the detected error occurrence area.

The recovery range indicates the size of the recovery target area, and is represented by the number of blocks and a setting value according to the number of blocks. The determined recovery range is associated with the storage model in which the processing is performed, and registered in the recovery correspondence table 11a. A medium error occurrence check is performed for each area in which the medium error is checked, for example, for each block. The details will be described later.

In normal processing, when a medium error is detected, the recovery processing unit 13 restores data in a recovery area including the data area in which the medium error occurs. When a medium error is detected as a response to an access request, the recovery processing unit 13 determines the data area and the storage on the basis of the access request. When a position at which the medium error occurs is set in a response which notifies of the medium error, the recovery processing unit 13 may determine the data area and the storage by using the position at which the medium error occurs. After the storage in which the error occurs and the data area including the error are determined in this way, the recovery processing unit 13 determines the model of the storage in which the error occurs, searches the recovery correspondence table 11a, and extracts the size of the recovery range corresponding to the model of the storage. Then, the recovery processing unit 13 determines the recovery area on the basis of the extracted recovery range and the data area in which the medium error is detected. For example, when the recovery range is two blocks, the recovery area is two blocks including the data area in which the medium error occurs. Then, the recovery processing unit 13 overwrites the recovery area with the data restored on the basis of a redundant configuration, and performs data restoration.

The access unit 14 transmits a read (R) request or a write (W) request to the storages 20a, 20b, and 20c belonging to the storage group 2 in accordance with an instruction from the recovery processing unit 13 and the recovery range detection unit 12, and receives a response. When an error occurs, an error notification is included in the response. The access unit 14 transmits the received response and error notification to the recovery range detection means 12 and the recovery processing unit 13 which are the request sources.

An operation and a data restoration method of the storage device having a configuration as described above will be described. Here, the recovery range is assumed to be unique to each model.

Figure 2A:
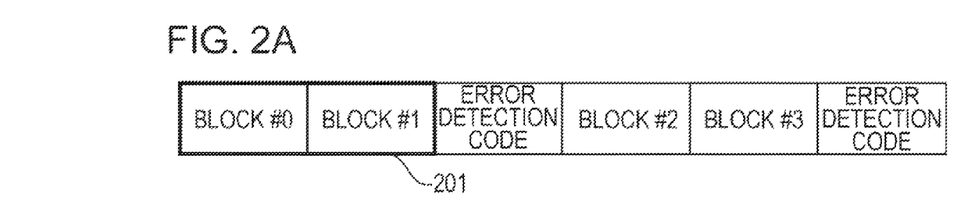
FIGS. 2A, 2B and 2C are diagrams illustrating an example of recovery range.
Figure 2B:
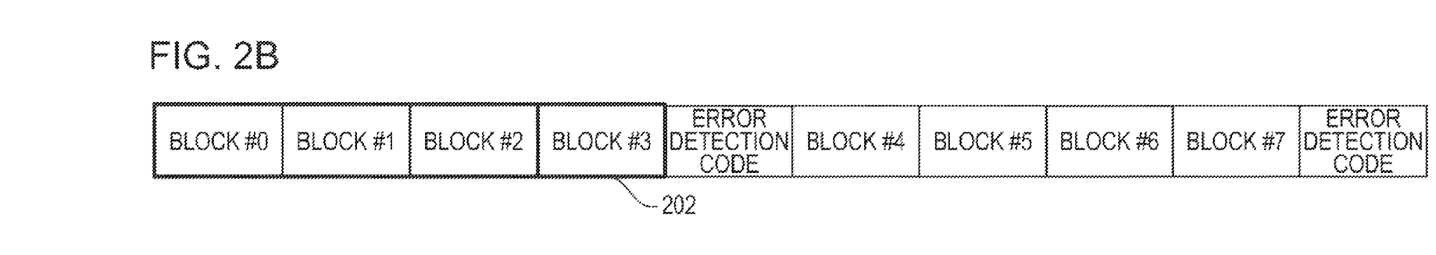
Figure 2C:
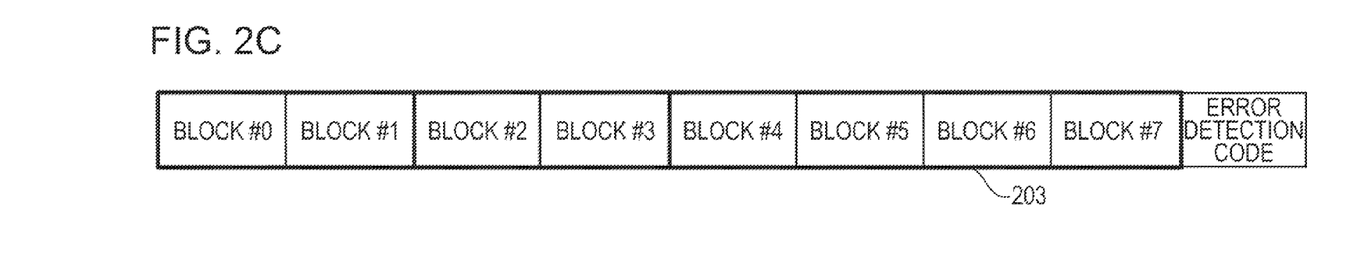

The recovery ranges unique to each model are set in the storages 20a, 20b, and 20c of the storage group 2 respectively. FIG. 2 is a diagram illustrating an example of the recovery ranges. Part (A) illustrates a case in which an error detection code is created for every two blocks, part (B) illustrates a case in which an error detection code is created for every four blocks, and part (C) illustrates a case in which an error detection code is created for every eight blocks. FIGS. 2A, 2B and 2C illustrate a relationship between the blocks and the error detection code, but does not illustrate a configuration of the physical storage area. The error detection code is stored in a given area in the physical storage area.

In the case FIG. 2A in which an error detection code is created for every two blocks, the error detection code is created for every two blocks such as for the blocks #0 to #1 and for the blocks #2 to #3. Therefore, the recovery range 201 is two blocks. For example, when the error detection code corresponding to the blocks #0 to #1 is broken, a medium error occurs in the block #0 and the block #1. The blocks #2 to #3 may be read correctly.

In the case FIG. 2B in which an error detection code is created for every four blocks, the error detection code is created for every four blocks such as for the blocks #0 to #3 and for the blocks #4 to #7. Therefore, the recovery range 202 is four blocks. For example, when the error detection code corresponding to the blocks #0 to #3 is broken, a medium error occurs in all the blocks from the blocks #0 to #3. The blocks #4 to #7 may be read correctly.

In the case FIG. 2C in which an error detection code is created for every eight blocks, the error detection code is created for every eight blocks such as for the blocks #0 to #7. Therefore, the recovery range 203 is eight blocks. For example, when the error detection code corresponding to the blocks #0 to #7 is broken, a medium error occurs in all the blocks from the blocks #0 to #7.

When the storage control device 1 starts up, or when a new storage device is connected to the storage control device 1, the recovery range detection unit 12 starts processing. The recovery range detection unit 12 reads the recovery correspondence table 11a from the storage unit 11, and checks whether or not the recovery range is registered for each model of the storages 20a, 20b, and 20c which are under management. When there is a model for which the recovery range is not registered, the recovery range detection unit 12 detects the recovery range by using the storage of the model. Here, it is assumed that the recovery range of the model of the storage 20a is not registered. The recovery range detection unit 12 rewrites the error detection code corresponding to an arbitrary recovery range stored in the storage 20a via the access unit 14, and modifies the error detection code. For example, the recovery range detection unit 12 reads data of an arbitrary block, rewrites the error detection code added to the data, and writes the error detection code along with the data of the block to modify the error detection code.

Next, the recovery range detection unit 12 detects an error occurrence area of a medium error. The recovery range detection unit 12 sequentially reads data of blocks via the access means 14, and checks whether a medium error occurs or not. For example, it is assumed that the recovery range detection unit 12 modifies the error detection code which covers the block #1 in the example of FIGS. 2A, 2B and 2C. When the recovery range detection unit 12 sequentially reads data from the block #0, in the case FIG. 2A, a medium error occurs in the blocks #0 to #1, and the block #2 is read correctly. In the case FIG. 2B, a medium error occurs in the blocks #0 to #3, and the block #4 is read correctly. In the case FIG. 2C, a medium error occurs in the blocks #0 to #7, and the block #8 is read correctly. In this way, when the error occurrence area is detected, the recovery range is determined. The recovery ranges of the cases FIGS. 2A, 2B and 2C are two blocks, four blocks, and eight blocks respectively. The determined recovery ranges are registered in the recovery correspondence table 11a.

Figure 3:
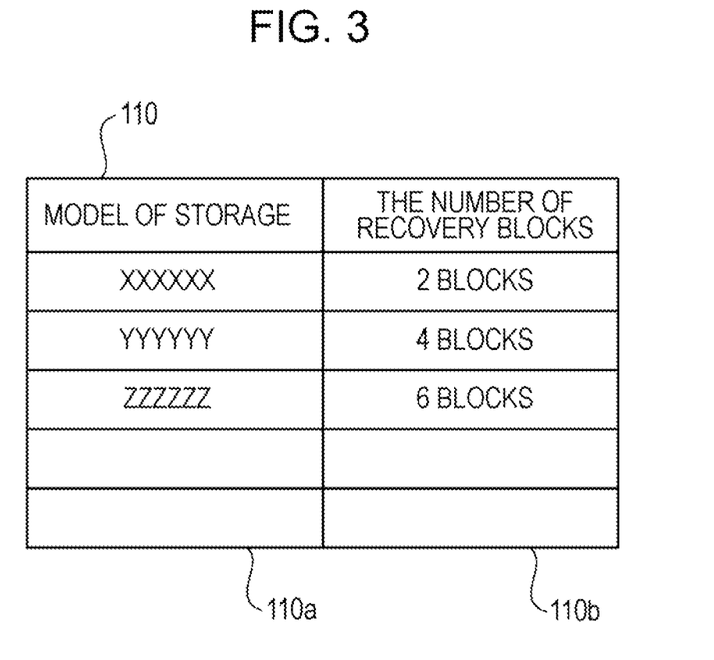
FIG. 3 is a diagram illustrating an example of a recovery correspondence table.

FIG. 3 is a diagram illustrating an example of the recovery correspondence table.

In the recovery correspondence table 110, the numbers of recovery blocks 110b are associated with the storage modes, and registered as the recovery ranges. For example, in the storage model "XXXXXX", the number of recovery blocks is "2 blocks".

When a medium error is notified, the recovery processing unit 13 determines the storage and data area in which the medium error occurs. Then, the recovery processing unit 13 refers to the recovery correspondence table 11a, determines the recovery range set for the model of this storage, and determines the recovery area from the recovery range and the data area. Further, the recovery processing unit 13 restores data of the recovery area on the basis of a redundant configuration, and overwrites the restored data on the recovery area to perform data restoration processing.

According to the above described storage control device and the data restoration method of the storage device, the recovery range unique to the model of the storage is automatically detected, and registered in the recovery correspondence table. When a medium error occurs in the storage, data in the recovery range is restored on the basis of the recovery correspondence table. In this way, a user need not register the recovery ranges for each model, and thus it is possible to reduce a burden on the user and increase convenience for the user. Also, a user operation when adding a new storage may be reduced. In addition, since the above operation is not a manual operation, a registration error and a registration failure may be prevented. As a result, a malfunction of the storage device may be prevented.

Hereinafter, the embodiments of the present invention will be described using a case of a multi-node disk system having a RAID configuration. The multi-node disk system may be applied to all RAID levels except for RAID 0.

Figure 4:
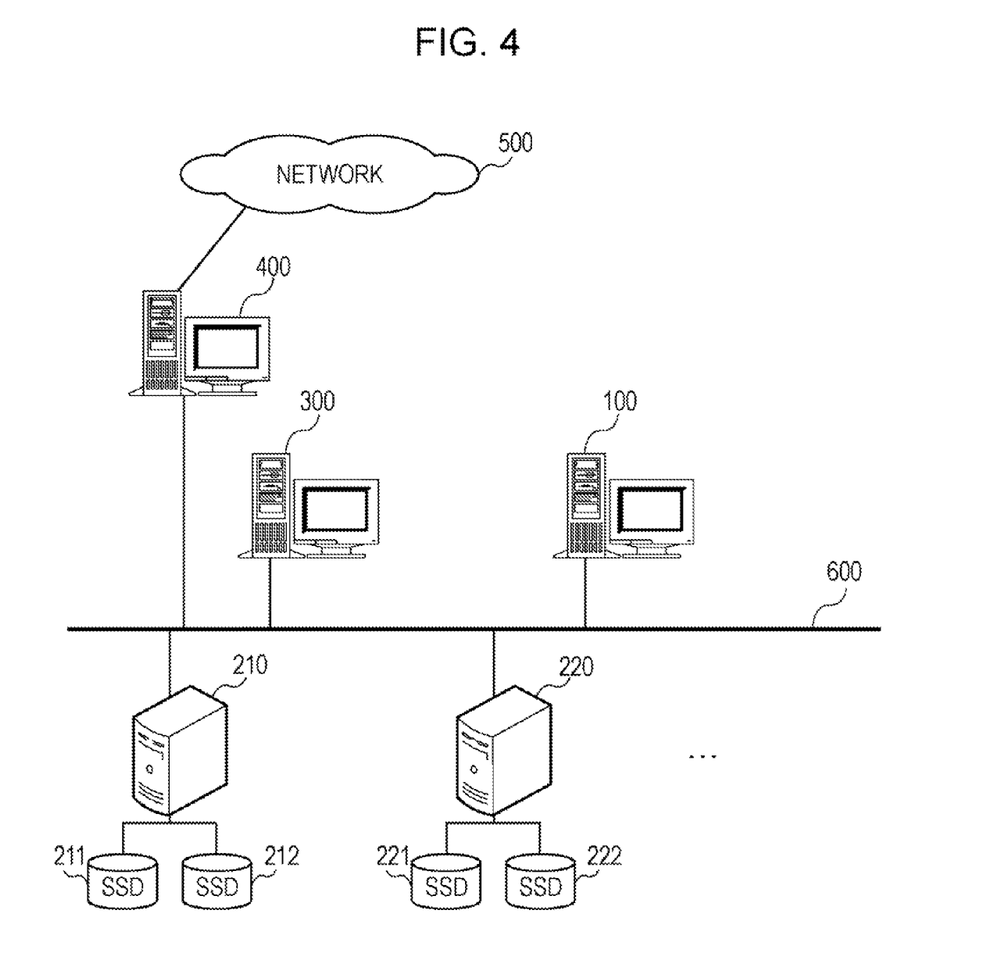
FIG. 4 is a diagram illustrating a configuration example of a multi-node disk system according to a second embodiment.

FIG. 4 is a diagram illustrating a configuration example of the multi-node disk system according to a second embodiment.

In the multi-node disk system, a control node 100, a plurality of disk nodes 210 and 220, a management node 300, and an access node 400 are connected to each other via a network 600.

The control node 100 functions as a storage control device for managing the disk nodes 210 and 220, and SSDs 211, 212, 221, and 222. The control node 100 performs assignment processing for assigning a virtual logical volume to the SSDs 211, 212, 221, and 222 which include a physical storage area, and data restoration processing for restoring data when an error is detected in data stored in the SSDs 211, 212, 221, and 222.

The SSDs 211 and 212 are connected to the disk node 210, and the SSDs 221 and 222 are connected to the disk node 220. The physical storage area in the SSDs 211, 212, 221, and 222 is divided into predetermined block units. The disk nodes 210 and 220 are, for example, computers of architecture called "IA (Intel Architecture". The disk nodes 210 and 220 transmit data stored in the SSDs 211, 212, 221, and 222 connected to the disk nodes 210 and 220 to a terminal device via the access node 400. When receiving a data write request of block units, the disk nodes 210 and 220 create an ECC for every one block or for every plurality of continuous blocks which are predetermined for each model of the SSDs 211, 212, 221, and 222, and store the ECC along with the data in the SSD physical storage area. When receiving a data read request, the disk nodes 210 and 220 perform a data check by using the ECC, and returns the read data along with the error check result of the data to the terminal via the access node 400. When an ECC error is detected, a medium error is generated. Although the disk nodes 210 and 220 manage a plurality of SSDs in FIG. 4, each SSD may have a function of the disk nodes 210 and 220.

The access node 400 knows the storage locations of the data managed by the disk nodes 210 and 220, and performs data access to the disk nodes 210 and 220 responding to the request inputted from a terminal via a network 500.

The management node 300 manages the entire multi-node disk system. The management node 300 notifies the control node 100 of a logical volume assignment instruction in accordance with an instruction from an administrator.

Figure 5:
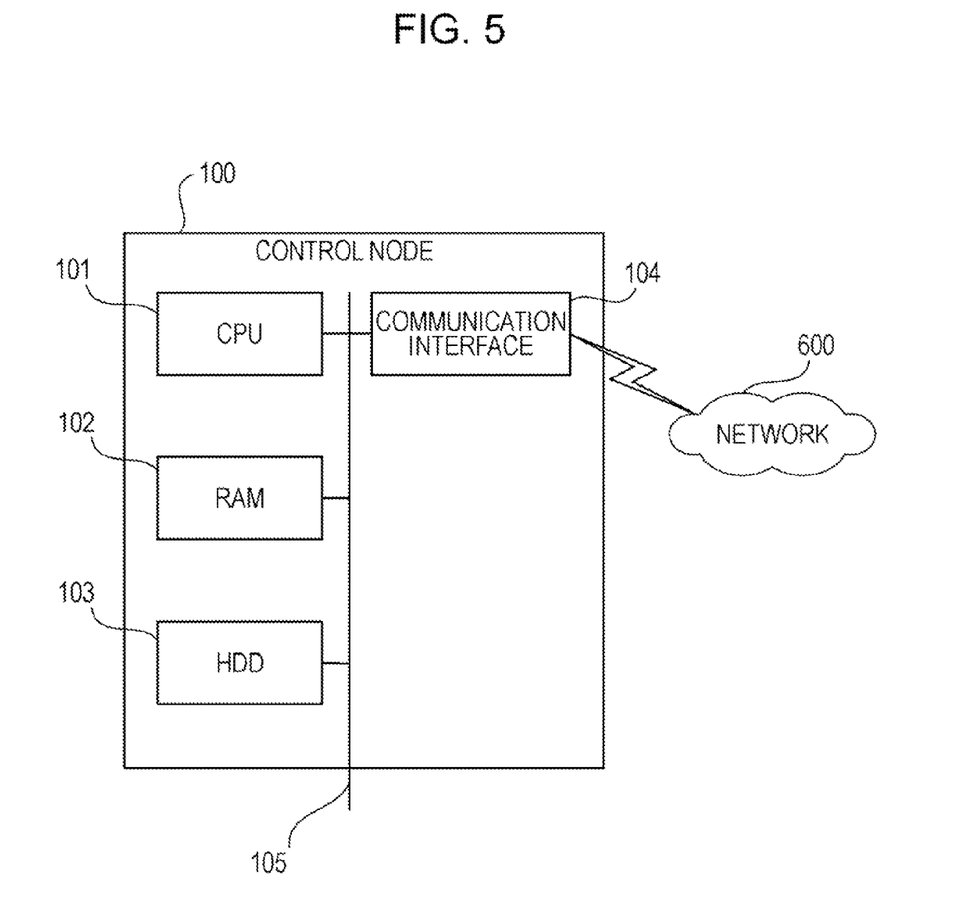
FIG. 5 is a diagram illustrating a hardware configuration example of a control node.

Next, a hardware configuration of each node will be described using the control node 100 as an example.

FIG. 5 is a diagram illustrating a hardware configuration example of the control node.

The entire device of the control node 100 is controlled by a CPU (Central Processing Unit) 101. A RAM (Random Access Memory) 102, an HDD 103, and a communication interface 104 are connected to the CPU 101 via a bus 105.

At least a part of OS and application programs which are executed by the CPU 101 is temporarily stored in the RAM 102. Also, various other data for processing by the CPU 101 is stored in the RAM 102. The OS and application programs are stored in the HDD 103. The communication interface 104 is connected to the network 600. The communication interface 104 transmits/receives data to/from other computers that are parts of the multi-node disk system, such as the disk nodes 210 and 220, the management node 300, and the access node 400 via the network 600.

While FIG. 5 illustrates the hardware configuration of the control node 100, the disk nodes 210 and 220, the management node 300, and the access node 400 have substantially the same hardware configuration as that of the control node 100.

The data restoration processing of the control node 100 in the multi-node disk system of the above configuration will be described using a specific example.

When the system starts up, the control node 100 checks whether or not the control node 100 has recovery range information related to the SSDs 211, 212, 222, and 222 under the management of the control node 100. The control node 100 searches the recovery correspondence table and checks whether the models of the SSDs 211, 212, 222, and 222 under the management are registered or not. If there is a model which is not registered, the control node 100 starts the recovery range detection processing. When a new SSD is added or an SSD is exchanged during operation, the control node 100 performs substantially the same check, and when there is an SSD which is not registered in the recovery correspondence table, the control node 100 starts the recovery range detection processing.

In the recovery range detection processing, an ECC is broken and an ECC error is generated. Then, the number of blocks belonging to the area in which the error occurs is measured, and the number of recovery blocks to be recovered is detected. A broken ECC indicates that the correct relationship between the ECC and the area covered by the ECC is broken. Here, the ECC is broken by rewriting the ECC.

Figure 6:
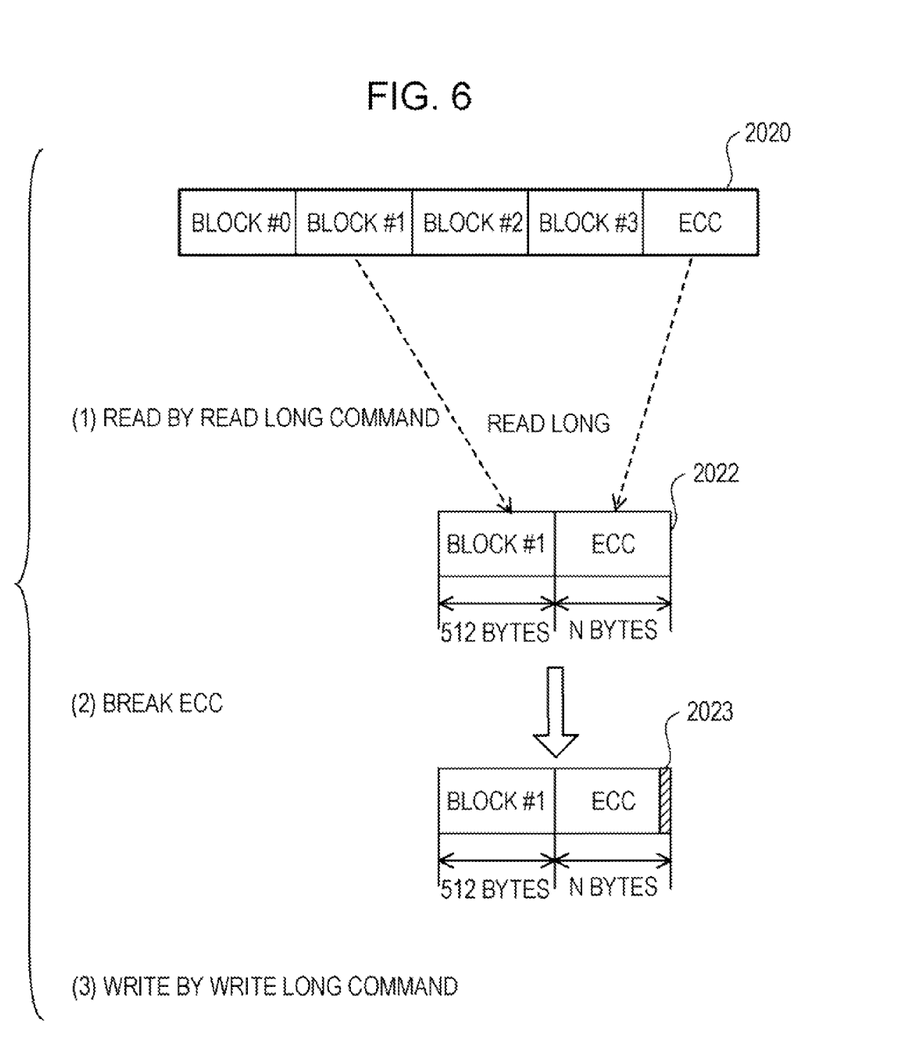
FIG. 6 is a diagram illustrating an example of an ECC rewrite procedure.

FIG. 6 is a diagram illustrating an example of the ECC rewrite procedure.

The ECC 2020 of FIG. 6 is generated on the basis of the data in four blocks from the block #0 to the block #3, and stored in a storage area in an SSD.

An appropriate size of buffer having a sufficient capacity is prepared on a memory to rewrite an ECC, and data of one block is read by "read long command" of SCSI (Small Computer System Interface) (1). In an example of FIG. 6, the data of the block #1 is read. The SSD which receives the command returns a response including the data of the block #1 to which an ECC is added. In the example of FIG. 6, as the read data from the SSD, 512 bytes of data of the block #1 and N bytes of ECC 2022 are received. The size of the ECC added to the read data varies depending on the model of SSD. When reading data from an SSD by using "read long command", a normal response is not returned unless "the number of bytes of one block+the number of bytes of KC" is correctly specified. Therefore, actually, the "read long command" is repeatedly issued until a normal response is received while incrementing the number of bytes of ECC in "the number of bytes of one block+the number of bytes of KC", starting from "the number of bytes of one block+1 byte". The ECC added to the block #1 is substantially the same as the ECC 2020, and the ECC is generated to cover the blocks #0 to #3.

Next, a part of the ECC is broken (2). For example, the last one byte of the ECC 2022 received and stored in the buffer is changed to a different value. For instance, bits of the last one byte are inverted to modify the ECC, and the ECC 2023 is created.

Then, the ECC 2023 which is the broken ECC 2022 and the data of the block #1 read in (1) are written by "write long command" (3). For example, the data of the block #1 is written by specifying "the number of bytes of one block+the number of bytes of KC". When writing data by the "write long command", the ECC is not recalculated.

In this way, the rewritten ECC 2023 is written to the SSD as an ECC of the blocks #0 to #3. As a result, an ECC error occurs when data is read from any one of all the four blocks #0 to #3.

Figure 7:
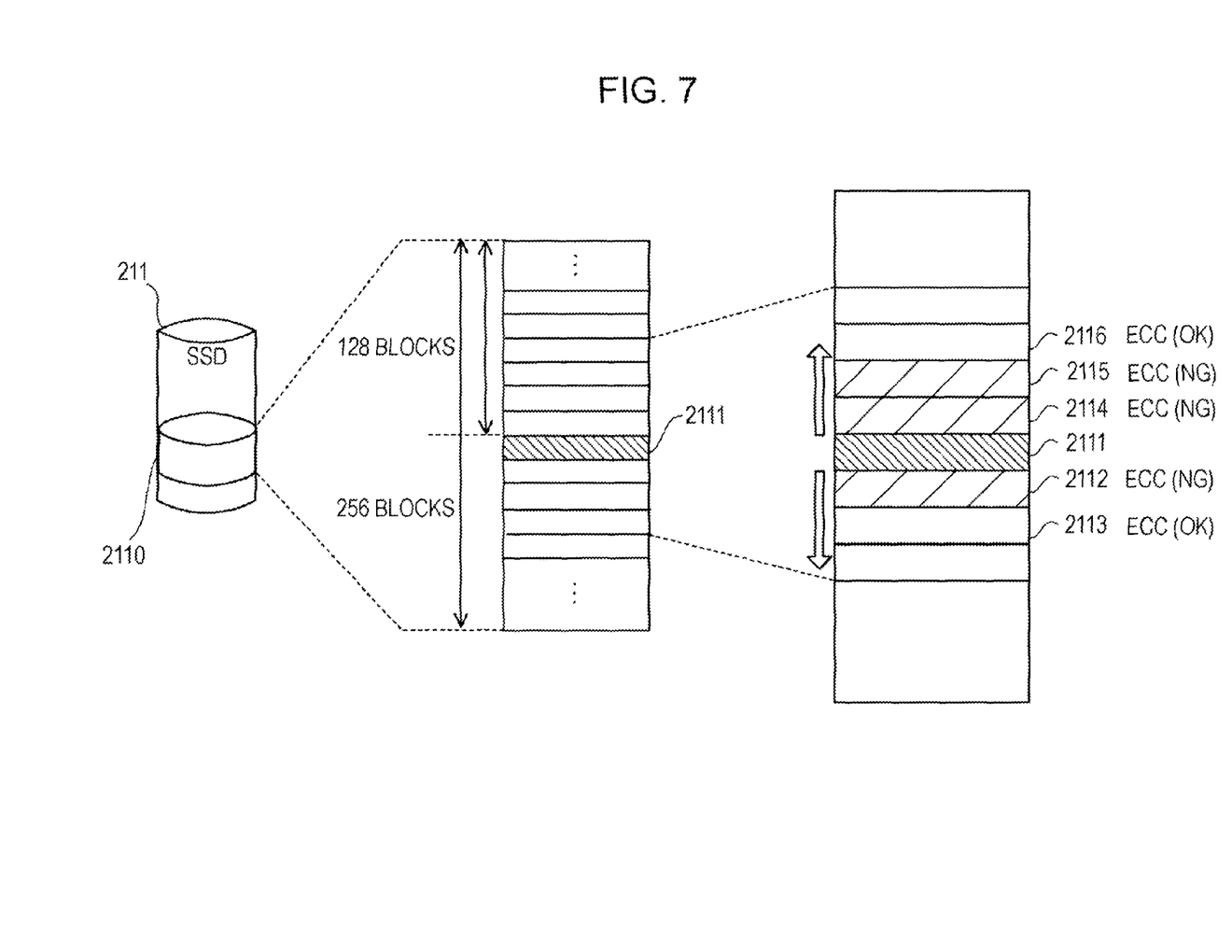
FIG. 7 is a diagram illustrating an example of detection processing of the number of recovery blocks.

The detection processing of the number of the recovery blocks will be described. FIG. 7 is a diagram illustrating an example of the detection processing of the number of the recovery blocks.

In FIG. 7, as an example, the SSD is SSD 211, and the number of the recovery blocks to be detected is four.

In the measurement processing of the number of the recovery blocks, a measurement area for detecting the recovery range is secured in a certain amount of free space. As the measurement area, an area which may include an area which is estimated to be a maximum recovery range is prepared. For example, an area which may store data of 256 blocks is prepared. Or, such a free space may be prepared in advance in the SSD 211.

In the example of FIG. 7, a measurement area 2110 for 256 blocks is secured in the free space in the SSD 211. Numbers are serially given to the blocks in the SSD 211 from the block #0, and a minimum block number included in the measurement area 2110 is 1022 (hereinafter, block number is referred to as LBA (Logical Block Address)). Specifically, the block numbers of the measurement area 2110 are from LBA 1022 to LBA 1278.

Next, the entire measurement area 2110 is overwritten by "write command". If the "write command" is used, an ECC is created for every certain number of recovery blocks when performing data overwrite processing. The entire measurement area 2110 is read by "read" command, and it is checked that an error such as an ECC error does not occur.

When the preparation is completed in this way, data including an ECC in a given block in the measurement area 2110, for example, data in the center block is read by the "read long command". In the example of FIG. 7, the 128th block (LBA 1150) 2111 is selected from the blocks of the measurement area 2110, and data and ECC of the block is read. Subsequently, the read ECC is broken by the procedure of FIG. 6, and the data read from the block 2111 and the ECC in which the last byte is rewritten are overwritten by the "write long command". In this way, an ECC error occurs in the blocks of the number of the recovery blocks including the block 2111.

To detect blocks in which the ECC error occurs, whether the ECC error occurs or not is checked sequentially in a forward direction and a backward direction from the center block that is the target block (LBA 1150) 2111. The forward direction is a descending direction of the LBA, and the backward direction is an ascending direction of the LBA.

In the example of FIG. 7, data is read by the "read long command" from the block (LBA 1151) 2112 backward next to the target block (LBA 1150) 2111 on which the "write long command" is performed. Here, the ECC error (NG) is detected. When the ECC error is detected, data is read from the backward next block (LBA 1152) 2113 by using the "read long command". Here, the normal response (OK) is acquired.

In this way, data is repeatedly and sequentially read from the blocks in the backward direction until the normal response is returned. The block having the maximum LBA in the blocks in which the ECC error is detected is stored. That is, in the example of FIG. 7, the block (LBA 1151) 2112 is stored. The number of blocks in which the ECC error is detected until the block having the maximum LBA in the blocks in which the ECC error is detected is found may be stored (in this case, "1" may be stored).

Substantially the same processing is performed in the forward direction. In the example of FIG. 7, in the forward direction from the target block (LBA 1150) 2111, data is read sequentially from the block (LBA 1149) 2114, the block (LBA 1148) 2115, and the block (LBA 1147) 2116 by using the "read long command". Here, the ECC error (NG) response is acquired from the block (LBA 1149) 2114, the ECC error (NG) response is acquired from the block (LBA 1148) 2115, and the normal (OK) response is acquired from the block (LBA 1147) 2116. The block having the minimum LBA in the blocks in which the ECC error is detected is stored. That is, in the example of FIG. 7, the block (LBA 1148) 2115 is stored. The number of blocks in which the ECC error is detected until the block having the minimum LBA in the blocks in which the ECC error is detected is found may be stored (in this case, "2" may be stored).

In this way, it is detected that the ECC error range is from the block (LBA 1148) 2115 to the block (LBA 1151) 2112. The recovery range may be calculated as "1151−1148+1=4" from the LBAs. Or, it is possible to sum up the number of blocks in which the ECC error is detected in the backward direction (2), the number of blocks in which the ECC error is detected in the forward direction (1), and the number of the target block (1).

Further, it is checked whether the LBA "1148" of the start block of the ECC error range may be divided by the number of the recovery blocks 4. In the SSD 211, the recovery range is set for every "4" blocks from the LBA 0, and thus the start block of the ECC error range, that is, the LBA of the start block of the recovery area, may be divided by the number of the recovery blocks. In this example, since the LBA "1148" of the start block of the ECC error range may be divided by the number of the recovery blocks 4, it is determined that the detected number of the recovery blocks is correct.

The number of the recovery blocks "4" determined by the above processing is associated with the model of the SSD 211 and stored in the recovery correspondence table.

Figure 8:
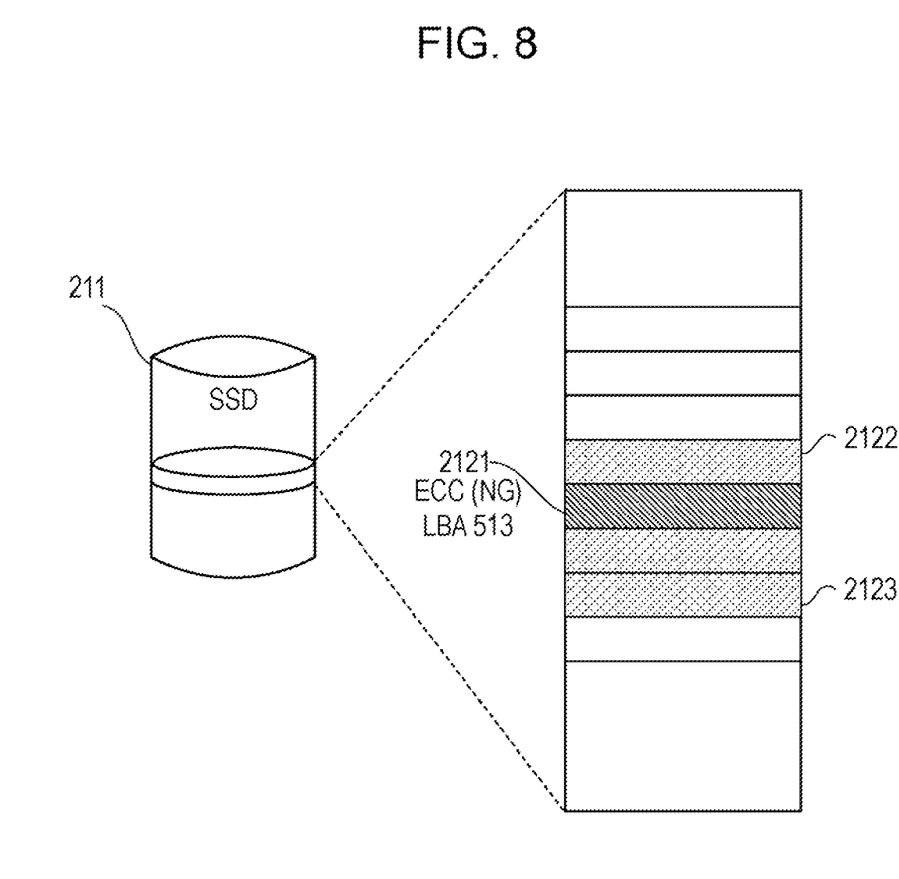
FIG. 8 is a diagram illustrating an example of recovery processing when a medium error occurs.

Next, the recovery processing when a medium error (ECC error) occurs will be described.

FIG. 8 is a diagram illustrating an example of the recovery processing when a medium error occurs.

It is assumed that an ECC error is detected when data is read from the block (LBA 513) 2121 by using the "read long command". The recovery area including the block (LBA 513) 2121 is calculated by using the number of the recovery blocks "4" of the SSD 211 obtained from the recovery correspondence table. The LBA of the start block of the recovery area is a value obtained by subtracting the remainder when the LBA of the error occurrence block is divided by the number of the recovery blocks from the LBA of the error occurrence block, and the size of the recovery is the number of the recovery blocks. Here, the recover area is from the recovery start block (LBA 512) 2122 to the recovery end block (LBA 515) 2123. The data in the recovery area is recovered from the redundant configuration one block by one block, and the data of four blocks are recovered.

According to the above multi-node disk system, the number of the recovery blocks unique to each model of the SSDs is automatically detected by using the free space in the SSDs. In this way, a registration operation of a user may be reduced. In addition, since a free space is used, the processing is performed without influencing the operation of the system.

Figure 9:
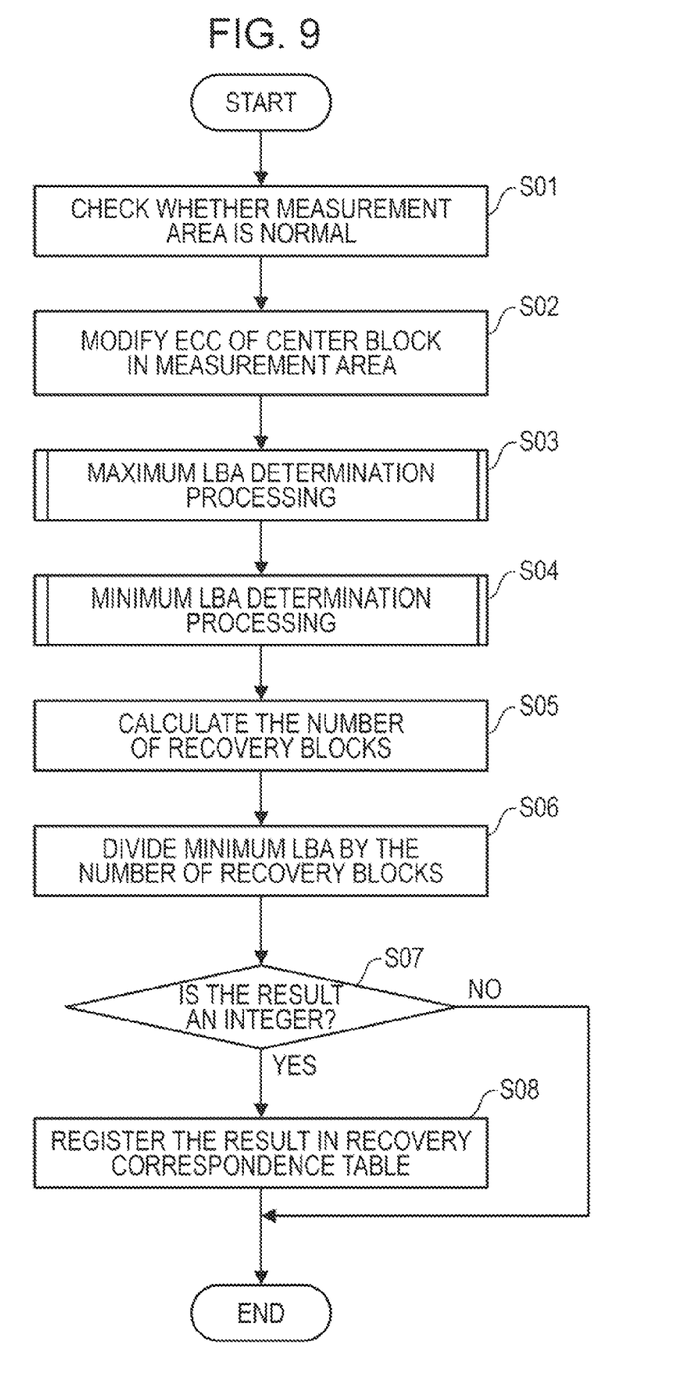
FIG. 9 is a flowchart illustrating a procedure of recovery range detection processing.
Figure 10:
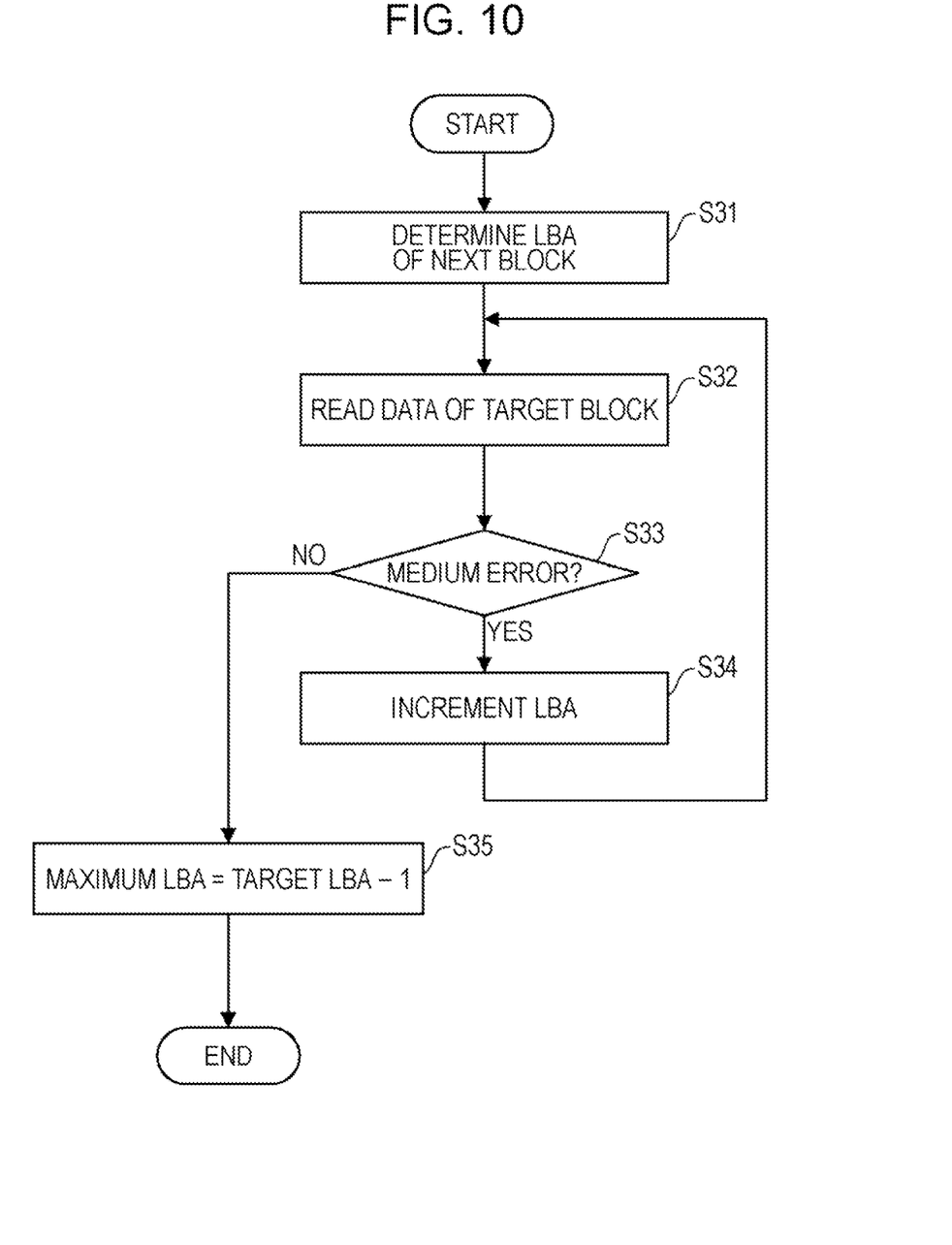
FIG. 10 is a flowchart illustrating a procedure of maximum LBA determination processing.
Figure 11:
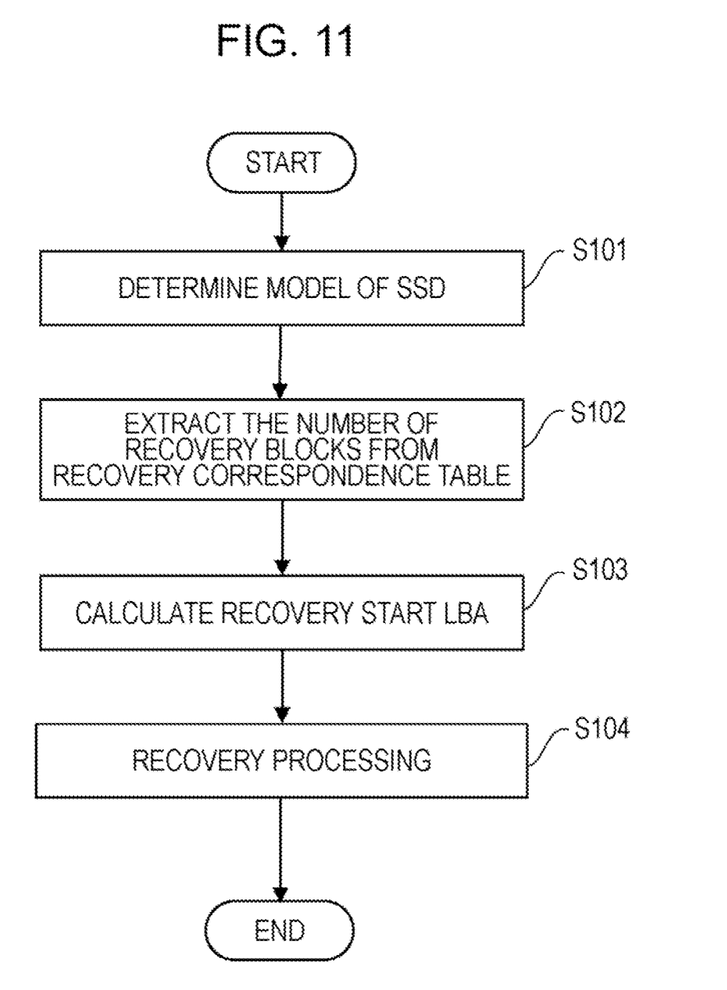
FIG. 11 is a flowchart illustrating a procedure of the recovery processing when a medium error occurs.

Next, the recovery range detection processing and the data restoration processing of the control node 100 will be described with reference to the flowcharts.

FIG. 9 is a flowchart illustrating the procedure of the recovery range detection processing.

A model of an SSD which is not registered in the recovery correspondence table is detected, and the processing starts.

[At S01] It is checked whether the measurement area of the number of the recovery blocks which is set in a free space that is not used to operate the system is normal or not. Data is overwritten on the measurement area block by block to generate an ECC. Subsequently, data is read from each block, and it is checked that an error such as an ECC error does not occur.

[At S02] One block at the center of the measurement area prepared in S01 is read, and the read ECC is rewritten and overwritten by the "write long command", so that the ECC is modified.

[At S03] Maximum LBA determination processing for detecting the end block of the ECC error range generated in step S02, which is the block having the maximum LBA in the ECC error range, is performed. The details will be described later.

[At S04] Minimum LBA determination processing for detecting the start block of the ECC error range generated in S02, which is the block having the minimum LBA in the ECC error range, is performed. The details will be described later.

[At S05] The number of the recovery blocks is calculated on the basis of the minimum LBA of the start block in the ECC error range and the maximum LBA of the end block in the ECC error range which are calculated in S04 and S03. Or, it is possible to record the number of blocks in which the ECC error is detected and obtain the recovery blocks by adding this number and the number of the target block (1) on which the "write long command" is used.

[At S06] The minimum LBA of the start block in the ECC error range determined in S04 is divided by the number of the recovery blocks calculated in S05.

[At S07] It is determined whether or not the calculation result of S06 is an integer, in other words, whether or not the minimum LBA may be divided by the number of the recovery blocks. When the calculation result is an integer, the process proceeds to step S08. When the calculation result is not an integer, the calculated number of the recovery blocks may be incorrect, and thus the process ends without registering the number of the recovery blocks in the recovery correspondence table.

[At S08] The number of the recovery blocks determined to be correct in S07 is associated with the model of the SSD, and registered in the recovery correspondence table, and then the process ends.

Here, the maximum LBA determination processing will be described. FIG. 10 is a flowchart illustrating the procedure of the maximum LBA determination processing.

[At S31] The LBA of the block next to the block to which data is written to modify the ECC by using the "write long command" is determined. The LBA may be calculated as "the LBA=LBA to which the data is written+1".

[At S32] The data of the block corresponding to the calculated LBA is read by the "read command", and it is determined whether or not the medium error (ECC error) occurs.

[At S33] When the medium error is detected by reading the data in S32, the process proceeds to step S34. When the medium error is not detected, the process proceeds to step S35.

[At S34] When the medium error is detected, the LBA of the block in which the medium error is detected is incremented, and the process returns to S32.

[At S35] When the medium error is not detected, the LBA of the block just before the block in which the medium error is detected is determined to be the maximum LBA in the ECC error range, and the process ends.

The minimum LBA determination processing will be described. In the maximum LBA determination processing, the ECC error range is detected while incrementing the LBA, whereas in the minimum LBA determination processing, the ECC error range is detected while decrementing the LBA. Therefore, when some words are replaced in the description of the processing procedure of FIG. 10 as described below, the minimum LBA determination processing may be described. The "next block" in step S31 is replaced by "previous block (the LBA=LBA to which the data is written−1)". The "increment LBA" in S34 is replaced by "decrement LBA". The "maximum LBA=target LBA−1" in S35 is replaced by "minimum LBA=target LBA+1".

Next, the recovery processing when a medium error (ECC error) occurs will be described. FIG. 11 is a flowchart illustrating the procedure of the recovery processing when a medium error occurs.

[At S101] The model of the SSD in which the medium error (ECC error) occurs is determined.

[At S102] The number of the recovery blocks corresponding to the model of the SSD determined in S101 is extracted by using the recovery correspondence table.

[At S103] The LBA of the recovery start block is calculated from the LBA of the block in which the medium error is detected. The LBA of the start block of the recovery area is calculated by subtracting the remainder when the LBA in which the medium error occurs is divided by the number of the recovery blocks from the LBA in which the medium error occurs.

[At S104] The block of the LBA calculated in S103 is used as the recovery start block, and the recovery processing is performed on the blocks corresponding to the number of the recovery blocks from the recovery start block on the basis of the redundant configuration.

By performing the above processing procedure, the recovery processing of the data area in which the medium error occurs is realized.

The above processing function may be realized by a computer. In this case, a program is provided in which a processing content of the function that should be included in the storage control device is written. By executing the program on the computer, the above processing function is realized on the computer. The program in which the processing content is written may be recorded in a computer-readable recording medium.

When distributing the program, for example, portable recording media such as DVDs (Digital Versatile Disc) and CD-ROMs (Compact Disc Read Only Memory) in which the program is recorded are sold. Also, the program may be stored in a storage device in a server computer, and the program may be transferred from the server computer to another computer via a network.

For example, the computer which executes the program stores the program recorded in the portable medium or the program transferred from the server computer in a storage device of the computer. The computer reads the program from the storage device of the computer, and performs processing according to the program. Also, the computer may read the program directly from the portable medium, and perform processing according to the program. Also, every time a program is transferred from the server computer to the computer, the computer may perform processing according to the received program.

According to various embodiments of the disclosed storage control device and data restoration method for a storage device, the recovery range is automatically detected and registered in the recovery correspondence table, and when a medium error occurs, the recovery range is determined by using the recovery correspondence table and data restoration processing is performed. In this way, it is possible to reduce a troublesome operation to register the recovery ranges in advance and help prevent the storage device from malfunctioning owing to a registration error.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

What is claimed is:
1. A storage control apparatus, comprising:
   a storage unit having a plurality of blocks for storing data, an error check code to detect data error in each of the plurality of blocks,
   a processor to execute a process to at least:
      modify an error check code stored in the storage unit,
      detect each of the plurality of blocks in which a data reading error occurs in the storage unit based on the modified error check code, and
      determine the number of detected blocks in the storage unit.
2. The storage control apparatus according to claim 1, further comprising:
   a plurality of storage units, each having a plurality of blocks for storing data, an error check code to detect data error in each of the plurality of blocks.
3. The storage control apparatus according to claim 2, wherein the data stored in a block of one of the plurality of storage units is restorable by using data stored in a block of another of the plurality of storage units.
4. The storage control apparatus according to claim 3, wherein the processor to execute the process to further:
   identify a recovering range of blocks in the one of the plurality of storage units based on the determined number of detected blocks.
5. The storage control apparatus according to claim 4, wherein the processor to execute the process to further:
   restore the data stored in the blocks in accordance with one of the error check code stored in one of the plurality of storage units on the basis of the determined number of the block of the one of the plurality of storage units.
6. The storage control apparatus according to claim 1, wherein the processor to execute the process to further:
   read the data and the error check code corresponding to the data from the storage unit.

7. The storage control apparatus according to claim 1, wherein the processor to execute the process to further:
   write the data and the modified error check code corresponding to the data into the storage unit.

8. The storage control apparatus according to claim 1, wherein the storage unit is solid state disk.

9. The storage control apparatus according to claim 1, wherein the processor to execute the process to further:
   repeatedly and sequentially read data from the blocks until the normal response is returned.

10. A non-transitory computer readable medium storing a management program for controlling a storage control apparatus including a storage unit having a plurality of blocks for storing data, an error check code to detect data error in each of the plurality of blocks, a process executed by the storage control apparatus comprising:
   modifying an error check code stored in the storage unit,
   detecting each of the plurality of blocks in which a data reading error occurs in the storage unit based on the modified error check code, and
   determining the number of detected blocks in the storage unit.

11. The non-transitory computer readable medium according to claim 10, wherein the storage control apparatus further includes a plurality of storage units, each having a plurality of blocks for storing data, an error check code to detect data error in each of the plurality of blocks.

12. The non-transitory computer readable medium according to claim 11, wherein the data stored in a block of one of the plurality of storage units is restorable by using data stored in a block of another of the plurality of storage units.

13. The non-transitory computer readable medium according to claim 12, wherein the process further executes identifying a recovering range of blocks in the one storage unit based on the determined number of detected blocks.

14. The non-transitory computer readable medium according to claim 13, wherein the process further executes restoring the data stored in the blocks in accordance with one of the error check code stored in one of the plurality of storage units on the basis of the determined number of the block of the one of the plurality of storage units.

15. The non-transitory computer readable medium according to claim 10, wherein the process further executes reading the data and the ECC corresponding to the data from the storage unit.

16. The non-transitory computer readable medium according to claim 10, wherein the process further executes writing the data and the modified ECC corresponding to the data into the storage unit.

17. The non-transitory computer readable medium according to claim 10, wherein the storage unit is solid state disk.

18. The non-transitory computer readable medium according to claim 10, wherein the process further executes repeatedly and sequentially reading data from the blocks until the normal response is returned.

* * * * *